United States Patent
An

(10) Patent No.: US 8,977,990 B2
(45) Date of Patent: Mar. 10, 2015

(54) EXPOSURE MONITORING KEY TO DETERMINE MISALIGNMENT BETWEEN BLIND AND RETICLE

(71) Applicant: Samsung Display Co., Ltd., Yongin, Gyeonggi-Do (KR)

(72) Inventor: Young-Sik An, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/856,164

(22) Filed: Apr. 3, 2013

(65) Prior Publication Data

US 2014/0176932 A1    Jun. 26, 2014

(30) Foreign Application Priority Data

Dec. 24, 2012  (KR) .......................... 10-2012-0152504

(51) Int. Cl.
  *G06F 17/50*  (2006.01)
  *G03F 1/22*  (2012.01)
(52) U.S. Cl.
  CPC ...................................... *G03F 1/22* (2013.01)
  USPC .................. 716/54; 716/50; 716/55; 716/56; 430/5; 250/491.1
(58) Field of Classification Search
  USPC .................. 716/50, 54–56; 430/5; 250/491.1
  See application file for complete search history.

(56) References Cited

U.S. PATENT DOCUMENTS

| | | | | |
|---|---|---|---|---|
| 4,393,311 A * | 7/1983 | Feldman et al. | ........... | 250/459.1 |
| 4,952,815 A * | 8/1990 | Nishi | ............. | 250/548 |
| 5,298,761 A * | 3/1994 | Aoki et al. | ................... | 250/548 |
| 5,581,324 A * | 12/1996 | Miyai et al. | ..................... | 355/53 |
| 5,583,609 A * | 12/1996 | Mizutani et al. | ................ | 355/46 |
| 5,601,957 A * | 2/1997 | Mizutani et al. | ................ | 430/22 |
| 5,646,413 A * | 7/1997 | Nishi | ............. | 250/548 |
| 5,734,478 A * | 3/1998 | Magome et al. | ............. | 356/401 |
| 5,811,211 A * | 9/1998 | Tanaka et al. | ................... | 430/30 |
| 6,048,650 A * | 4/2000 | Lin | ................................. | 430/5 |
| 6,114,072 A | 9/2000 | Narimatsu | | |
| 6,337,162 B1 * | 1/2002 | Irie | ................................. | 430/5 |
| 6,509,956 B2 * | 1/2003 | Kobayashi | ....................... | 355/55 |
| 6,607,863 B2 * | 8/2003 | Irie | ................................. | 430/30 |
| 6,701,512 B2 | 3/2004 | Sutani et al. | | |
| 6,737,207 B2 * | 5/2004 | Imai | ................................. | 430/30 |
| 7,018,932 B2 * | 3/2006 | Ito et al. | ........................ | 438/708 |
| 7,359,029 B2 * | 4/2008 | Finders et al. | ................... | 355/30 |
| 7,666,553 B2 | 2/2010 | Hosono et al. | | |
| 7,713,664 B2 * | 5/2010 | Ishiwata | ............................ | 430/5 |
| 7,755,207 B2 * | 7/2010 | Sogawa et al. | ................. | 257/797 |
| 8,698,984 B2 * | 4/2014 | Matsui et al. | ................. | 349/106 |

(Continued)

FOREIGN PATENT DOCUMENTS

| | | |
|---|---|---|
| KR | 1999-0066719 | 8/1999 |
| KR | 2002-0062829 | 7/2002 |

(Continued)

*Primary Examiner* — Naum B Levin
(74) *Attorney, Agent, or Firm* — Robert E. Bushnell, Esq.

(57) ABSTRACT

A reticle including exposure monitoring keys. The reticle includes an exposure region that is to be exposed to light during an exposure process, and a non-exposure region surrounding the exposure region and not to be exposed to the light. The exposure monitoring keys are disposed across a boundary between the exposure region and the non-exposure region.

19 Claims, 10 Drawing Sheets

(56) References Cited

U.S. PATENT DOCUMENTS

2012/0133914 A1* 5/2012 Prosyentsov et al. ........... 355/53
2013/0088700 A1* 4/2013 Kim et al. ....................... 355/71

FOREIGN PATENT DOCUMENTS

| KR | 10-2007-0063397 | 6/2007 |
| KR | 10-2010-0079307 A | 7/2010 |

* cited by examiner

EXPOSURE MONITORING KEY TO DETERMINE MISALIGNMENT BETWEEN BLIND AND RETICLE

CLAIM OF PRIORITY

This application makes reference to, incorporates the same herein, and claims all benefits accruing under 35 U.S.C. §119 from an application earlier filed in the Korean Intellectual Property Office on Dec. 24, 2012 and duly assigned Serial No. 10-2012-0152504.

BACKGROUND OF THE INVENTION

1. Field of the Invention

Embodiments of the present invention generally relate to a reticle, and more particularly, to a reticle including an exposure monitoring key, an exposure apparatus including the reticle, and an exposure method.

2. Description of the Related Art

Recently, as an information-oriented society has developed rapidly, various digital appliances have been developed accordingly. Such digital appliances include components, such as memory/non-memory semiconductor chips and flat panel display apparatuses, which are fabricated by performing micro patterning processes that are beyond simple assembly processes. In particular, it is important to develop a micro patterning technology for forming thin, small, and large-capacity digital appliances. One widely used method of forming fine patterns is a photolithography method using light.

According to the photolithography method, for example, a film to be patterned is formed on a substrate, and photoresist having a photosensitive property is applied on the formed film. Then, light is irradiated to the photoresist by using a reticle on which desired patterns are formed and an exposure apparatus, and patterns are formed on the photoresist by using a chemical reaction and the patterns are then transferred to the film by using the patterned photoresist. In such a photolithography method, one of important processes is an exposure process in which light is irradiated to the photoresist by using a reticle.

An exposure apparatus performs an exposure process mainly by using a stepper method or a scanning method.

The scanning method is an exposure method in which an exposure is performed while a substrate and a reticle move in opposite directions at a constant speed ratio, and accordingly, an entire substrate may be exposed at once.

The stepper method is a step and repeat type, in which a plurality of fields are defined on a substrate, exposure of a field is performed through an exposure region of a projection reduction lens, and then, exposure is performed sequentially with respect to a next field. The stepper method has low productivity since alignment and exposure processes have to be repeated in order to expose a substrate including a plurality of fields. On the other hand, the stepper method has high overlay accuracy since the exposure may be performed once when one alignment key is detected from one entire field. Also, in the stepper method, an intensity of light irradiated onto the substrate may be adjusted only in a state where the substrate and the reticle are stopped, and thus, the exposure may be performed accurately.

When performing the exposure process by using the exposure apparatus, a blind attached to the exposure apparatus blocks some of the light irradiated from a light source to adjust the intensity and shape of the light irradiated to the reticle. However, twisting of a few to thousands of micrometers or hunting may occur due to problems of a driving motor of the blind, degradation of a light shielding blade sensor, bending of the light shielding blade, aging of a timing belt, abnormal operation of an encoder, defects of a driving board, etc. In this case, defective patterns may be formed on the substrate due to misalignment between the blind and the reticle, and therefore, an additional defect detecting process has to be performed in order to sense the defective pattern every time.

SUMMARY OF THE INVENTION

The present invention provides a reticle including an exposure monitoring key so as to easily determine a misalignment between a blind and a reticle.

The present invention also provides an exposure apparatus including the reticle and an exposure method.

The present invention also provides a method of manufacturing a flat panel display by using the exposure method.

According to an aspect of the present invention, there is provided a reticle including: an exposure region that is to be exposed to light during an exposure process; a non-exposure region surrounding the exposure region, and not to be exposed to the light; and exposure monitoring keys disposed to cross a boundary between the exposure region and the non-exposure region.

The boundary between the exposure region and the non-exposure region may be formed as a rectangle, and the exposure monitoring keys are disposed at sides of the boundary, which face each other.

The boundary between the exposure region and the non-exposure region may be formed as a rectangle, and the exposure monitoring keys are disposed respectively at four sides of the boundary.

The exposure region may include a pattern region in which target patterns are disposed, a part of each of the exposure monitoring keys is disposed in the exposure region from out of the pattern region, and the other part of the each exposure monitoring key may be disposed in the non-exposure region.

The reticle may further include alignment marks disposed in the exposure region for aligning the reticle and an exposed member in the exposure process.

Each of the exposure monitoring keys may be symmetrical to the boundary.

Each of the exposure monitoring keys may be an embossed exposure monitoring key for shielding against the light, and a peripheral portion of each embossed exposure monitoring key may be for transmitting the light.

Each of the exposure monitoring keys may be an engraved exposure monitoring key for transmitting the light, and a peripheral portion of each engraved exposure monitoring key may be for blocking the light.

The boundary between the exposure region and the non-exposure region may be formed as a rectangle, an exposure monitoring key disposed at one of sides of the boundary, which face each other, may be an embossed exposure monitoring key for shielding against the light, and the exposure monitoring key disposed at the other side of the boundary may be an engraved exposure monitoring key transmitting the light.

Each of the exposure monitoring keys may include gradations for representing a degree of dislocation of an actual exposure region that is exposed during the exposure process from the exposure region.

According to another aspect of the present invention, there is provided an exposure apparatus including: a light source for emitting light for performing an exposure process; a reticle comprising an exposure region that is to be exposed to light during an exposure process, a non-exposure region surrounding the exposure region, which is not to be exposed to the light, and exposure monitoring keys disposed to cross a boundary between the exposure region and the non-exposure region; and a blind disposed between the light source and the reticle and comprising an open region so that a part of the light emitted from the light may reach the exposure region.

The blind may include a pair of first blades that are movable in a first direction, and the open region may have a width that is variable according to the pair of the first blades. The exposure monitoring keys of the reticle may include a pair of first exposure monitoring keys, at least a part of which is not exposed to the light due to the pair of first blades.

The blind may further include a pair of second blades movable in a second direction, and the open region may have a length that is variable according to the pair of second blades. The exposure monitoring keys of the reticle may include a pair of second exposure monitoring keys, at least a part of which is not exposed to the light due to the pair of second blades.

Each of the exposure monitoring keys may include gradations, and the gradations denote a degree of dislocation of an actual exposure region, which the light actually reaches after passing through the open region of the blind, from the exposure region.

According to another aspect of the present invention, there is provided an exposure method including: emitting light from a light source; transmitting a first part of the light emitted from the light source and blocking a second part of the light by using a blind; and projecting images of target patterns of a reticle and partial images of exposure monitoring keys formed on the reticle onto a substrate by using the first part of the light. The reticle includes an exposure region that is to be exposed to light during an exposure process, a non-exposure region surrounding the exposure region and not to be exposed to the light, and the exposure monitoring keys disposed to cross a boundary between the exposure region and the non-exposure region.

The exposure method may further include determining a dislocation degree of the actual exposure region, which the first part of the light actually reaches through the reticle, from the exposure region.

The blind may include a pair of first blades movable in a first direction, the first part of the light being adjusted by the pair of first blades, the exposure monitoring keys comprise a pair of first exposure monitoring keys, at least a part of which is not exposed to the light due to the pair of first blades, and images of the at least part of the pair of first exposure monitoring keys may be projected onto the substrate by the first part of the light.

According to another aspect of the present invention, there is provided a method of manufacturing a flat panel display apparatus, the method comprising performing exposure of a substrate by using the exposure method.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
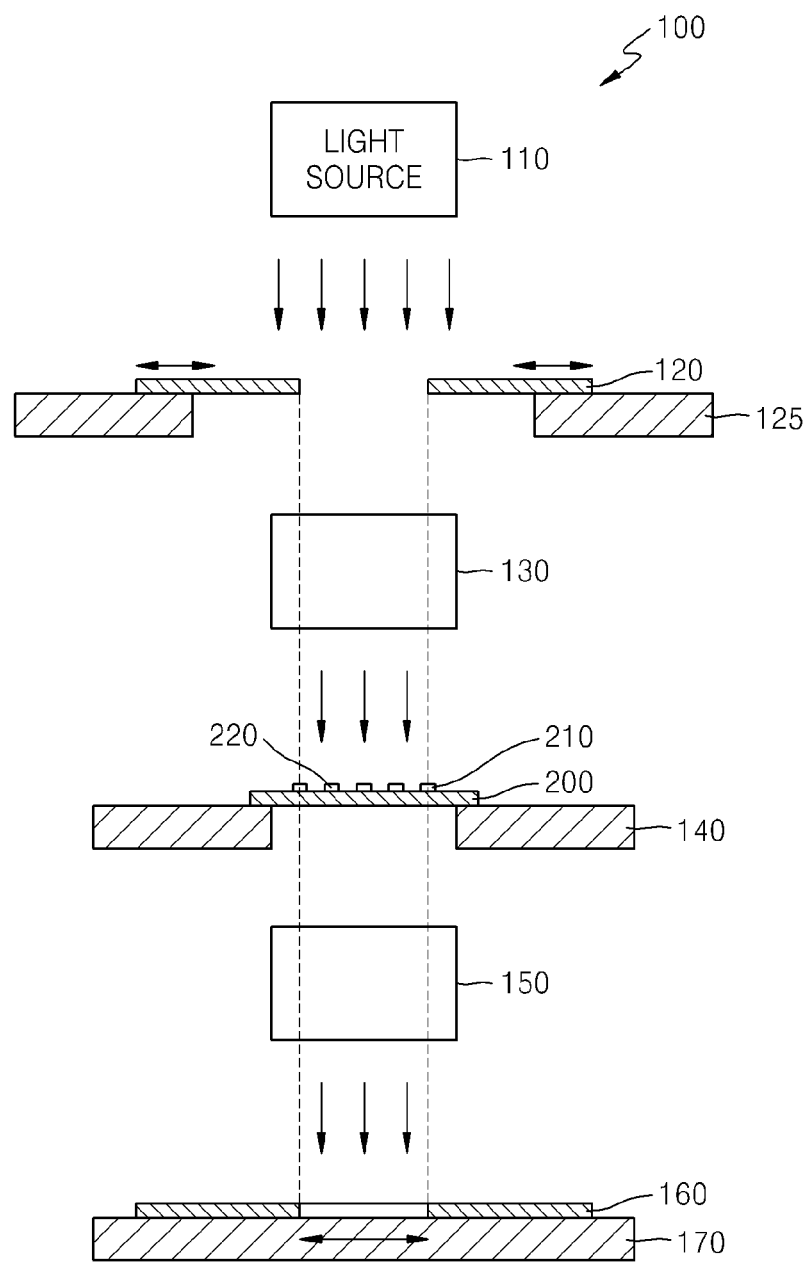
FIG. 1 is a diagram schematically showing a structure of an exposure apparatus constructed as an embodiment according to the principles of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. However, this is not intended to limit the present invention to particular modes of practice, and it is to be appreciated that all changes, equivalents, and substitutes that do not depart from the spirit and technical scope of the present invention are encompassed in the present invention.

Like numbers refer to like elements throughout, and sizes of structures may be exaggerated or reduced for clarity.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added. As used herein, the term "and/or" includes any and all combinations of one or more of the associated listed items. While such terms as "first," "second," etc., may be used to describe various components, such components must not be limited to the above terms. These terms are only used to distinguish one element, component, region, layer or section from another region, layer or section. Thus, a first element, component, region, layer or section discussed below could be termed a second element, component, region, layer or section without departing from the teachings of the present invention.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein, the term "and/or" includes any and all combinations of one or more of the associated listed items. Expressions such as "at least one of," when preceding a list of elements, modify the entire list of elements and do not modify the individual elements of the list.

FIG. 1 is a diagram schematically showing a structure of an exposure apparatus 100 constructed as an embodiment according to the principles of the present invention.

Referring to FIG. 1, the exposure apparatus 100 according to the embodiment of the present invention includes a light source 110, a blind 120, an illuminating optical system 130, a reticle support 140 for supporting a reticle 200, a projection optical system 150, and a substrate support 170 for supporting a substrate 160.

The light source 110 may emit light for performing an exposure process. The blind 120 blocks some of the light emitted from the light source 110, and may transmit some of the light so that the light may be irradiated to a required portion only. The illuminating optical system 130 may adjust an intensity and an optical property of the light transmitted through the blind 120.

The reticle support 140 may support the reticle 200 placed thereon. The reticle 200 may include a transparent region and an opaque region, which define a pattern to be transferred onto photoresist on a surface of the substrate 160.

The projection optical system 150 may irradiate the light transmitted through the reticle 200 to the substrate 160. The substrate support 170 may support the substrate 160. Although not shown in FIG. 1, a photoresist material may be applied on the substrate 160. The photoresist material may be classified as a negative photoresist material and a positive photoresist material.

When the negative photoresist material is applied to the substrate 160, a portion exposed to light is hardened and a portion that is not exposed to the light may be removed during a developing process. When the negative photoresist material is used, a pattern that has an opposite shape to that of the reticle 200 is formed on the substrate 160.

When the positive photoresist material is applied on the substrate 160, a portion exposed to the light may be removed during a developing process. When the positive photoresist material is used, a pattern equal to that of the reticle 200 is formed on the substrate 160.

The light source 110 may provide light for projecting the pattern of the reticle 200 on the photoresist of the substrate 160 to induce a photochemical reaction on the photoresist. During performing of the exposure of the photoresist, photochemical transformation occurs in the photoresist material. The photoresist material reacts with light of a certain wavelength, and generally ultraviolet (UV) rays are used to expose the photoresist. However, the present invention is not limited thereto, and an electromagnetic wave such as X-ray, an electron beam, and an ion beam may be used. The light source 110 may be a mercury arc lamp generating arcs that are discharged when an electric current flows through a tube including a mercury-xenon gas. Also, the light source 110 may be an excimer laser generating light of a deep ultraviolet (DUV) wavelength that is equal to or less than 248 nm. Alternatively, the light source 110 may be a light source irradiating an extreme ultraviolet (EUV) ray for generating fine patterns by using plasma.

The blind 120 may be installed on the blind support 125. The blind 120 may shield against unnecessary light. The blind 120 may include an open region for transmitting only some of the light.

The open region may have an adjustable size. The exposure apparatus 100 may be the apparatus of a stepper method, and the size of the open region may vary depending on a portion of the substrate 160, which will be exposed. For example, the size of the open region may be adjusted so that six display cells may be exposed simultaneously or four display cells may be exposed simultaneously. The open region may be adjusted according to locations of the display cells.

Also, the reticle 200 may include one pattern region on which the pattern is formed, or a plurality of pattern regions. An image of one pattern region selected from among the plurality of pattern regions may be projected onto the substrate 160. In this case, the light has to be irradiated only to the selected pattern region, but not to the other peripheral pattern regions. The blind 120 may be used to shield against the light emitted from the light source 110 so as not to irradiate the light to the other pattern regions. Also, the plurality of pattern regions formed on the reticle 200 may have different sizes from each other, and to achieve this, the open region of the blind 120 needs to be adjusted.

The blind 120 may include a blade (not shown in FIG. 1) for shielding against light in order to adjust the open region, and the blade may be moved with respect to the blind support 125 or may be fixed on the blind support 125. The blade will be discussed later.

The light transmitted through the blind 120 has to be irradiated to the region on the reticle 200, on which the pattern is formed. To do this, the blind 120 and the reticle 200 have to be aligned accurately with respect to each other; however, a misalignment may occur between the blind 120 and the reticle 200. Therefore, an additional test process may be necessary in order to determine whether the misalignment occurs.

The illuminating optical system 130 includes at last one mirror (not shown) and/or a plurality of lenses (not shown), and transfers the light emitted from the light source 110 so that light having a desired illumination distribution may be incident to the reticle 200. FIG. 1 shows that parallel light transmitted through the blind 120 is incident to the illuminating optical system 130 and transferred to the reticle 200 in parallel; however, the light may be transferred along a much more complex optical path than that described here.

The reticle 200 is a transparent plate having a pattern image that may be transferred to the substrate 160 coated with the photoresist, and may be mounted on the reticle support 140. The reticle 200 may include a metal pattern formed on, for example, a quartz substrate, and the metal pattern may be the same as or reversed from the pattern that is to be formed on the photoresist material of the substrate 160.

The reticle 200 may include the pattern regions on which patterns 220 are disposed. The pattern region may refer to a region on which the patterns 220 that are transferred to the substrate 160 by one exposure process are arranged. When one pattern region is disposed on the reticle 200, the reticle 200 may be fixedly mounted on the reticle support 140.

On the other hand, when a plurality of pattern regions are formed on the reticle 200, the reticle 200 may be movably mounted on the reticle support 140. A pattern region may be selected to correspond to a processing location of the substrate 160, and the reticle 200 may be moved on the reticle support 140 so that the pattern region may be exposed. In this case, the reticle 200 has to be moved to a precise location so that the light transmitted through the blind 120 may be irradiated to the pattern region.

Exposure monitoring keys 210 and the patterns 220 may be formed on the reticle 200. The patterns 220 correspond to the pattern that will be formed on the photoresist of the substrate 160, and the patterns 220 are for forming structural elements for further realizing circuits on the substrate 160. The patterns 220 may be referred to as target patterns since the patterns 220 are transferred onto the substrate 160 by the irradiated light.

The exposure monitoring keys 210 may be formed on outer portions of the patterns 220 so as to easily determine whether the blind 120 and the reticle 200 are well aligned with each other. In particular, the reticle 200 may include an exposure region that is to be exposed to the light from the light source 110, and a non-exposure region that surrounds the exposure region and is not to be exposed to the light. A boundary between the exposure region and the non-exposure region may be defined virtually, not physically. The patterns 220 have to be transferred to the photoresist of the substrate 160, and thus, are located in the exposure region.

The exposure monitoring keys 210 may be disposed at a boundary of the exposure region and the non-exposure region. The exposure monitoring keys 210 may be disposed to cross over the boundary. In particular, a center of each exposure monitoring key 210 may pass through the boundary, and each exposure monitoring key 210 may extend perpendicularly to the boundary.

A part of each exposure monitoring key 210 is exposed to the light transmitted through the blind 120, and the other part may be blinded from the light by the blind 120. If the blind 120 and the reticle 200 are aligned with each other accurately, the region to which the light transmitted through the open region of the blind 120 is irradiated may be completely equal to the exposure region of the reticle 200. In this case, if the center of an exposure monitoring key 210 is located at the boundary between the exposure region and the non-exposure region, only half the exposure monitoring key 210 is exposed to the light, and a pattern corresponding to the half of the exposure monitoring key 210 will be formed on the photoresist of the substrate 160.

However, the blind 120 and the reticle 200 may be misaligned to some degree, and in this case, the actual exposure region to which the light is irradiated may be slightly different from the exposure region of the reticle 200. In this case, only some of the exposure monitoring key 210 is exposed to the light, and a pattern corresponding to the above part of the exposure monitoring key 210 may be only formed on the photoresist of the substrate 160.

The exposure monitoring key 210 may includes gradations, and thus, a degree of misalignment between the actual exposure region and the exposure region of the reticle 200 may be identified easily through the pattern formed on the photoresist of the substrate 160, wherein the pattern corresponds to a part of the exposure monitoring key 210. The exposure monitoring key 210 may have a size that allows it to be viewed by the naked eye, and an operator may easily identify a misalignment degree between the reticle 200 and the blind 120 and a dislocation degree between the actual exposure region and the exposure region of the reticle 200 from the pattern formed on the photoresist of the substrate 160. The operator may easily check whether the misalignment is in a normal range without having to perform an additional process, even if the misalignment between the blind 120 and the reticle 200 occurs.

The projection optical system 150 may transfer the light transmitted through the reticle 200 onto the substrate 160. In more detail, the projection optical system 150 may include at least one minor (not shown) and/or a plurality of lenses (not shown), and may transfer an image of the target pattern 220 after passing through the reticle 200 onto the substrate 160. The projection optical system 150 may focus a reduced light image on the photoresist of the substrate 160.

The substrate 160 may be supported by the substrate support 170, and may be moved along an upper surface of the substrate support 170 above the substrate support 170 by a driving unit (not shown).

The substrate 160 may be a glass substrate, a plastic substrate, and a metal substrate for manufacturing a flat panel display apparatus such as an organic light emitting display apparatus and a liquid crystal display (LCD) apparatus. Also, the substrate 160 may be semiconductor wafer substrate for manufacturing a semiconductor device. The substrate 160 may be referred to as an exposed member.

The substrate 160 may include a plurality of exposure regions. The exposure region refers to a region on which an exposure process is performed once. The exposure region may correspond to one display cell. Otherwise, the exposure region may include a plurality of display cells. For example, the exposure region may include display cells of two columns and three rows, or two columns and two rows. The exposure region may correspond to one semiconductor chip. Otherwise, the exposure region may correspond to a plurality of semiconductor chips, for example, two columns and two rows.

When an exposure process is performed to a corresponding exposure region of the substrate 160, the substrate 160 may be moved on the substrate support 170 so as to perform an exposure process to a next exposure region.

The reticle support 140 and the substrate support 170 may be independently driven from each other. If necessary, only one of the reticle support 140 and the substrate support 170 may be moved, or both the supports 140 and 170 may be simultaneously moved.

Figure 2A:
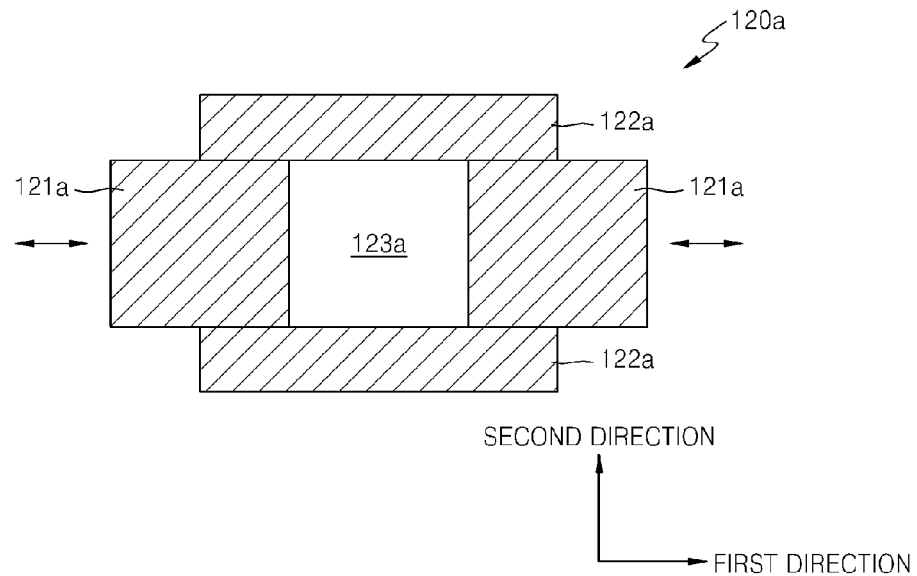
FIG. 2A is a diagram schematically showing a blind according to an example, which may be adopted in an exposure apparatus constructed as embodiments according to the principles of the present invention.

FIG. 2A is a diagram schematically showing a blind 120a that may be adopted by an exposure apparatus constructed as embodiments according to the principles of the present invention.

Referring to FIG. 2A, the blind 120a includes a pair of movable blades 121a and a pair of fixed blades 122a, and an open region 123a is defined by the pair of movable blades 121a and the pair of fixed blades 122a. The pair of movable blades 121a may be independently moved with respect to the blind support 125 shown in FIG. 1 along a first direction. The pair of fixed blades 122a may be fixed on the blind support 125 of FIG. 1.

The open region 123a may have a fixed length defined by the pair of fixed blades 122a and a variable width defined by the pair of movable blades 121a. In FIG. 2A, the first direction and a second direction may be switched.

Figure 2B:
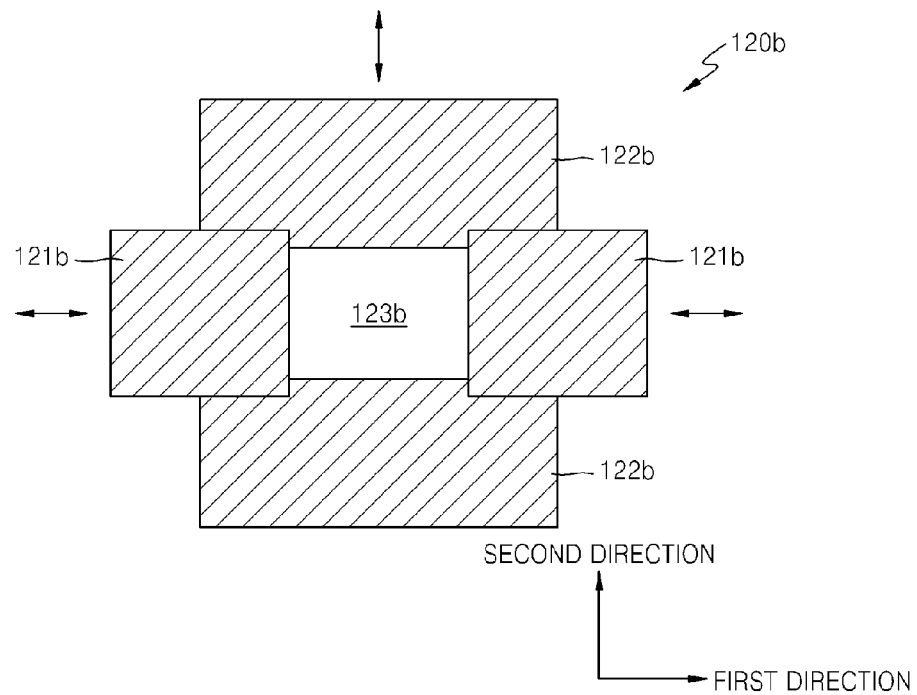
FIG. 2B is a diagram schematically showing a blind according to another example, which may be adopted in an exposure apparatus constructed as embodiments according to the principles of the present invention.

FIG. 2B is a diagram schematically showing a structure of a blind 120b according to another example, wherein the blind 120b may be adopted in an exposure apparatus constructed as embodiments according to the principles of the present invention.

Referring to FIG. 2B, the blind 120b may include a pair of movable blades 121b and a pair of movable blades 122b, and an open region 123b is defined by the pair of movable blades 121b and a pair of movable blades 122b. The pair of movable blades 121b may be independently moved with respect to each other and with respect to the blind support 125 shown in FIG. 1 along a first direction. The pair of movable blades 122b may be independently moved with respect to each other and with respect to the blind support 125 shown in FIG. 1 along a second direction.

The open region 123b has a variable width defined by the pair of movable blades 121b and a variable length defined by the pair of movable blades 122b.

Figure 3A:
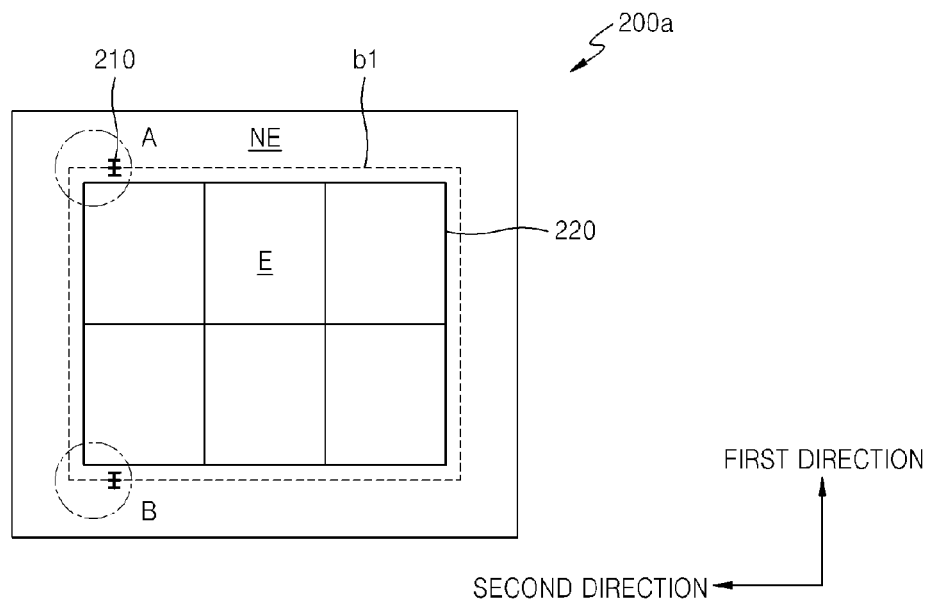
FIG. 3A is a diagram schematically showing a reticle that may be used when the blind of FIG. 2A is used in an exposure apparatus constructed as an embodiment according to the principles of the present invention.

FIG. 3A is a diagram schematically showing a reticle 200a according to an example used when the blind 102a shown in FIG. 2A is adopted in the exposure apparatus according to the embodiment of the present invention.

Referring to FIG. 3A, the reticle 200a includes an exposure region E and a non-exposure region NE. The exposure region E is a region that is designed to be exposed to the light, and the non-exposure region NE is a region that is designed not to be exposed to the light. A boundary line bl denotes a boundary between the exposure region E and the non-exposure region NE. The boundary line bl may be a virtual line forming the shape of a rectangle. However, the present invention is not limited thereto, and the boundary line bl may configure other shapes, for example, a polygonal shape such as a triangle, a pentagon, and a hexagon, a circular shape, or an oval shape.

The patterns 220 that will be transferred to the substrate 160 may be formed in the exposure region E. As shown in FIG. 1, the patterns 220 may be patterns for forming a plurality of display cells or a plurality of semiconductor chips, for example.

The exposure monitoring keys 210 may be disposed on lines of the boundary line bl, which face each other in a first direction. That is, in FIG. 3A, the exposure monitoring keys 210 may be disposed respectively at an upper boundary line bl and a lower boundary line bl.

As described earlier with reference to FIG. 2A, since the movable blades 121a may move along the first direction, the width of the open region 123a in the first direction may vary. Therefore, an actual exposure region that is exposed to the light through the open region 123a may not coincide with the exposure region E. In particular, since the movable blade 121a may move along the first direction, the actual exposure region may not coincide with the exposure region E at the upper and lower boundary lines bl among the upper, lower, left, and right boundary lines bl. Therefore, the exposure monitoring keys 210 may be disposed at the upper and lower boundary lines bl.

The exposure monitoring key 210 disposed on the upper boundary line bl will be described in more detail with reference to FIG. 4A. Also, the exposure monitoring line 210 disposed on the lower boundary line bl will be described in more detail with reference to FIG. 4B.

Figure 3B:
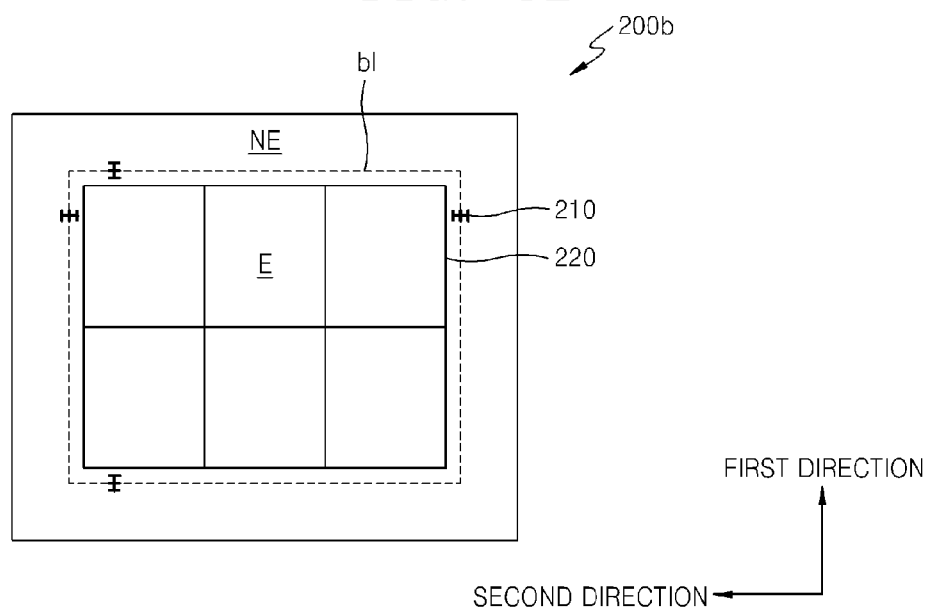
FIG. 3B is a diagram schematically showing a reticle that may be used when the blind of FIG. 2B is used in an exposure apparatus constructed as another embodiment according to the principles of the present invention.

FIG. 3B is a diagram schematically showing a reticle according to another example, which may be used when the blind 120b of FIG. 2B is adopted in the exposure apparatus according to the embodiment of the present invention.

Referring to FIG. 3B, the reticle 200b is the same as the reticle 200a of FIG. 3A except that the exposure monitoring keys 210 are also disposed at the left and right boundary lines bl. Differences between the reticle 200b and the reticle 200a will be described below.

The exposure monitoring keys 210 are disposed at the left and right boundary lines bl, as well as at the upper and lower boundary lines bl. Since the blind 120b shown in FIG. 2B includes four movable blades 121b and 122b, the open region 123b defined by four movable blades 121b and 122b has a variable length in the second direction, as well as a variable width in the first direction. Therefore, the actual exposure region corresponding to the open region 123b may not coincide with the exposure region in all four directions, that is, the upper, lower, left, and right boundary lines bl. Since the exposure monitoring keys 210 are formed to evaluate the dislocation degree between the reticle 200b and the blind 120b, the exposure monitoring keys 210 may be disposed at the four boundary lines bl as shown in FIG. 3B.

The reticles 200a and 200b shown in FIGS. 3A and 3B may be some parts of the entire reticle. For example, the entire reticle may include a plurality of exposure regions, and the reticles 200a and 200b may respectively show one exposure region from among the plurality of exposure regions.

Figure 4A:
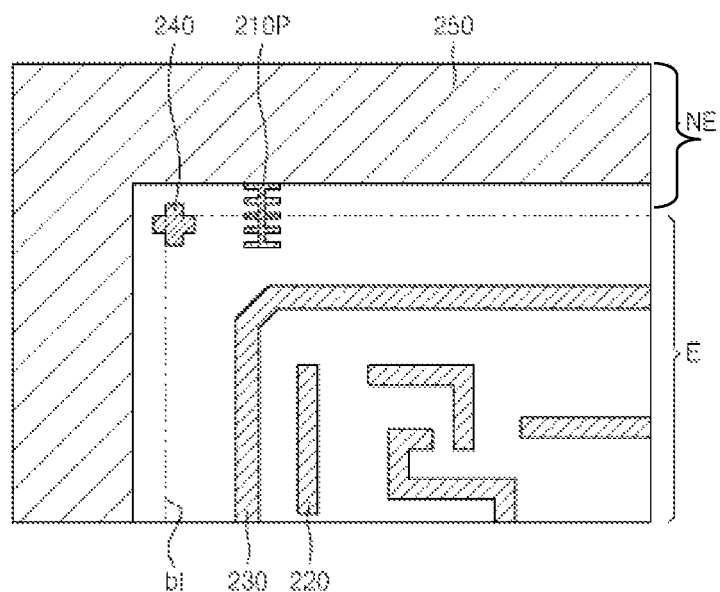
FIG. 4A is an enlarged view of a portion A shown in FIG. 3A.

FIG. 4A is an enlarged view of a portion A of FIG. 3A.

Referring to FIG. 4A, the portion A of the reticle 200a is a left upper corner portion in the exposure region E. However, the present invention is not limited thereto; an exposure monitoring key 210p may be disposed at an upper right corner or at the upper boundary line bl.

The reticle 200a of FIG. 4A is exemplary shown as a positive type reticle 200a; however, the present invention is not limited thereto, and the above example may be applied to a negative type reticle. Also, the reticle 200a shown in FIG. 4A may be used in a photolithography process for forming a thin film transistor (TFT) of a flat panel display. However, this is merely an example, and the reticle may be for forming a different structure of a different apparatus or a different structure of the same apparatus.

Like in FIG. 3A, boundary lines bl may virtually exist between the exposure region E and the non-exposure region NE. The exposure monitoring key 210p may be disposed so that a center thereof may cross the boundary line bl. The exposure monitoring key 210p may be an embossed exposure monitoring key that is formed as an opaque region. That is, the pattern portion is formed as an opaque region and a peripheral portion thereof is transparent.

The exposure monitoring key 210p may be symmetric based on the boundary line bl. As shown in FIG. 3A, the exposure monitoring key 210p may include a portion extending perpendicular to the boundary line bl, and gradations crossing the extended portion. That is, the exposure monitoring key 210p may have a fish bone shape. Although not shown in the drawings, distances from the boundary line may be marked near the gradations. For example, a gradation may denote a gap of 250 um. The above value is exemplary.

As described above, the patterns 220 may be disposed on the exposure region E. FIG. 4A exemplary shows patterns for forming wires. A guard ring pattern 230 may be disposed around the patterns 220. The guard ring pattern 230 may define a display cell, and may be a pattern for protecting the display cells from static elasticity. The guard ring 230 may be omitted. An inside area of the guard ring pattern 230 may be referred to as a pattern region.

A part of the exposure monitoring key 210p is located in the exposure region E outside of the pattern region, and the other part of the exposure monitoring key 210p may be located in the non-exposure region NE.

An alignment mark 240 may be disposed in the exposure region outside the pattern region. The alignment mark 240 may be provided for aligning the reticle 200a and the substrate 160. In FIG. 4A, the alignment mark 240 is disposed on a corner of the boundary line bl; however, the present invention is not limited thereto, and the alignment mark 240 may be disposed on another location. The alignment mark 240 may be disposed in the pattern region 240.

According to another example, the exposure monitoring key 210p and the alignment mark 240 may be combined with each other. That is, the alignment mark 240 may be removed, and a part of the exposure monitoring key 210p may be used as the alignment mark.

An edge portion 250 may be disposed in the non-exposure region NE. The edge portion 250 may be formed as an opaque region. The edge portion 250 may prevent unnecessary hardening of the substrate 160 due to dispersal of light.

Figure 4B:
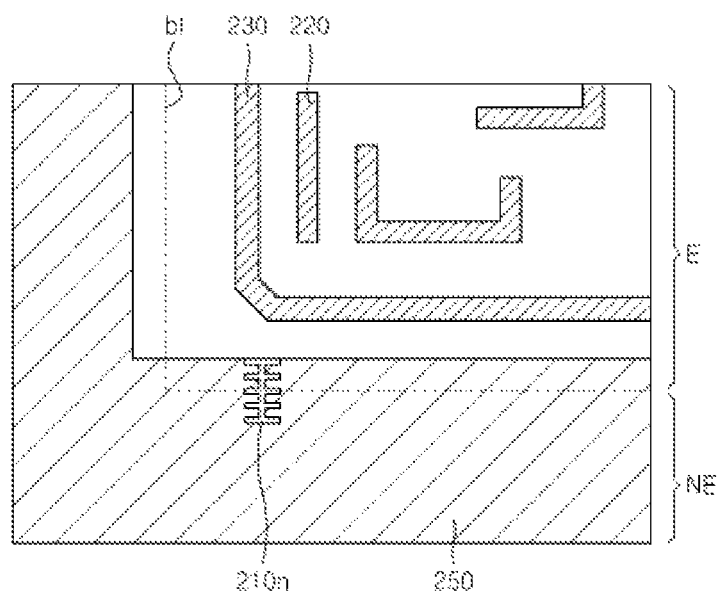
FIG. 4B is an enlarged view of a portion B shown in FIG. 3A.

FIG. 4B is an enlarged view of a portion B of FIG. 3A.

Referring to FIG. 3B, the portion B of the reticle 200a is a lower left corner portion of the exposure region E. However, the present invention is not limited thereto, and an exposure monitoring key 210n may be disposed at a lower right corner portion or at the lower boundary line bl.

The reticle 200a shown in FIG. 4B is a positive type reticle; however, the present invention is not limited thereto.

Like in FIG. 4A, the patterns 220 and the guard ring pattern 230 may be disposed in the exposure region E. Also, the edge portion 250 may be disposed in the non-exposure region NE.

In FIG. 4B, the edge portion 250 may extend to the inside of the lower boundary line bl to correspond to a space between the upper boundary line bl and the edge portion 250 of FIG. 4A. Although the alignment mark 240 is not shown in FIG. 4B, the alignment mark 240 may be disposed in the portion B of FIG. 4B according to the present embodiment.

The exposure monitoring key 210n may be disposed so that a center thereof may cross the lower boundary line bl. The exposure monitoring key 210n may be an engraved exposure monitoring key 210n formed as a transparent region. That is, the pattern region may be a transparent region, and a peripheral portion thereof may be an opaque region. The engraved exposure monitoring key 210n may have the same shape as that of the embossed exposure monitoring key 210p.

FIG. 4B shows the engraved exposure monitoring key 210n; however, the present invention is not limited thereto, and the embossed exposure monitoring key 210p may be disposed in FIG. 4B. On the other hand, the engraved exposure monitoring key 210n may be disposed in the portion A of FIG. 4A.

FIGS. 5A through 5H are diagrams showing various exposure monitoring keys according to embodiments of the present invention.

FIGS. 5A through 5H show embossed exposure monitoring keys; however, the present invention is not limited thereto, that is, the exposure monitoring keys shown in FIGS. 5A through 5H may be engraved exposure monitoring keys.

Figure 5A:
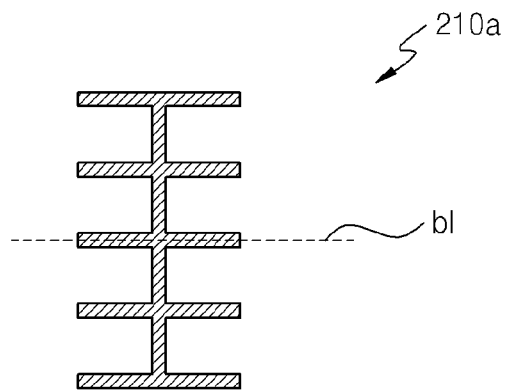
FIGS. 5A through 5H are diagrams showing an exposure monitoring key constructed as embodiments according to the principles of the present invention.

Referring to FIG. 5A, an exposure monitoring key 210a is shown. The exposure monitoring key 210a may have a fish bone shape, like the exposure monitoring key 210p shown in FIG. 4A. The exposure monitoring key 210a is symmetrical based on the boundary line bl, and may include a length portion extending perpendicularly to the boundary line bl and gradations extending in parallel with the boundary line bl. Lengths of the gradations may be equal to each other, or may be different from each other.

A center gradation may mark the boundary line bl. In addition, second and fourth gradations may represent that a dislocation degree of the actual exposure region from the exposure region E is included in a normal range. First and last gradations may denote a length of the exposure monitoring key 210a.

Although five gradations are shown in FIG. 5A, more gradations may be formed. In this case, an operator may easily identify from the gradations the dislocation degree of the actual exposure region from the exposure region E.

Although not shown in FIG. 5A, numerical values may be written on side portions of the gradations.

Figure 5B:
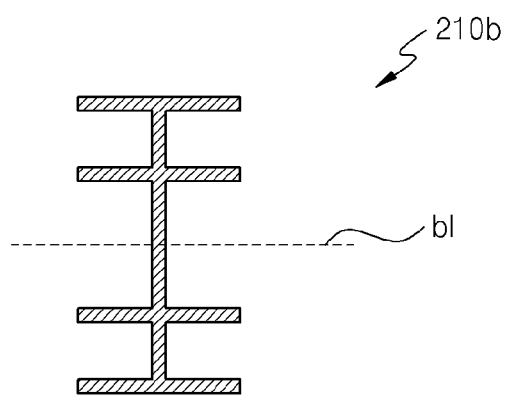

Referring to FIG. 5B, an exposure monitoring key 510b is shown. The exposure monitoring key 210b is the same as the exposure monitoring key 210a except that there is no gradation extending along the boundary line bl.

Figure 5C:
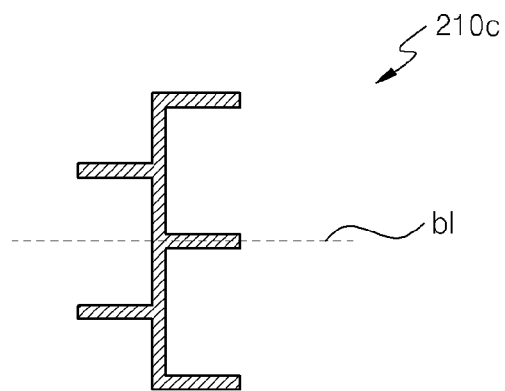

Referring to FIG. 5C, an exposure monitoring key 210c is shown. The exposure monitoring key 210c may include the gradations at only one side in a length direction thereof.

Figure 5D:
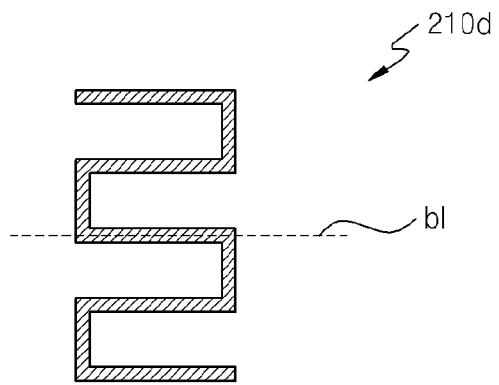

Referring to FIG. 5D, an exposure monitoring key 210d is shown. The exposure monitoring key 210d may have lengthwise portions divided at end portions of the gradations.

Figure 5E:
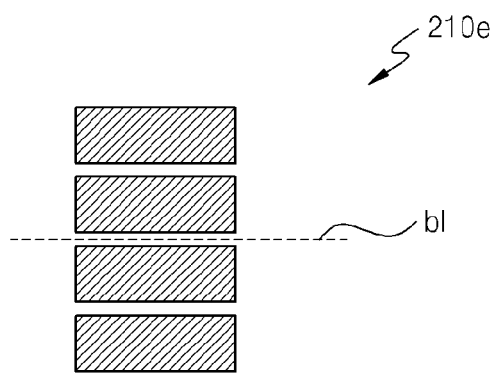

Referring to FIG. 5E, an exposure monitoring key 210e is shown. The exposure monitoring key 210e may include portions that are in parallel with the boundary line bl. The parallel portions may be spaced apart at predetermined distances from each other. The spaces between the parallel portions may correspond to the gradations shown in FIG. 5A. More parallel portions than those of FIG. 5E may be formed.

Figure 5F:
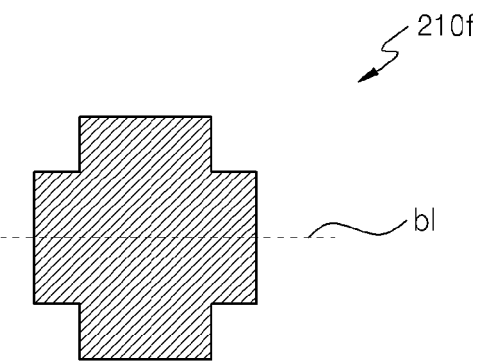

Referring to FIG. 5F, an exposure monitoring key 210f is shown. The exposure monitoring key 210f may have a cross shape. A center of the exposure monitoring key 210f may cross the boundary line bl.

The exposure monitoring key 210f may include a thick portion that is close to the boundary line bl and a thin portion on an outer side of the thick portion. Opposite ends of the thick portion may correspond to the second and fourth gradations of the exposure monitoring key 210a shown in FIG. 5A. In addition, opposite ends of the thin portion may correspond to the first and last gradations of the exposure monitoring key 210a shown in FIG. 5A.

The exposure monitoring key 210f may function as an alignment mark.

Figure 5G:
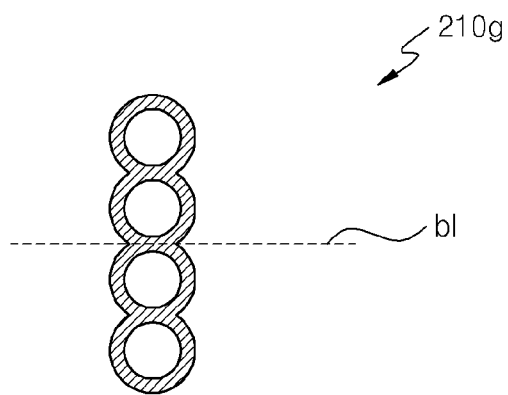

Referring to FIG. 5G, an exposure monitoring key 210g is shown. The exposure monitoring key 210g may be formed by connecting circles having constant sizes. The exposure monitoring key 210g may be symmetrical based on the boundary line bl. Portions where the circles overlap each other may correspond to the gradations of the exposure monitoring key 210a shown in FIG. 5A.

Figure 5H:
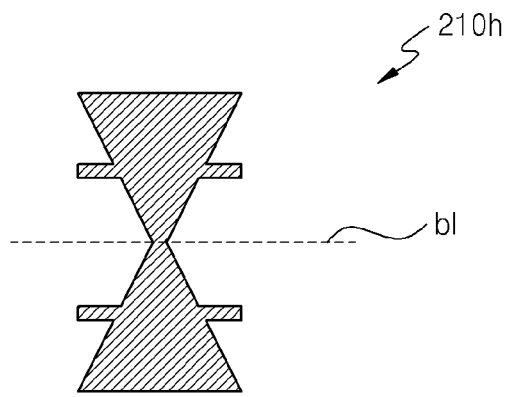

Referring to FIG. 5H, an exposure monitoring key 210h is shown. The exposure monitoring key 210h may include a triangle portion and gradations.

Although exposure monitoring keys having various shapes are shown in FIGS. 5A through 5H, the present invention is not limited thereto, that is, the exposure monitoring key may have another shape that is not shown in the above drawings.

Figure 6A:
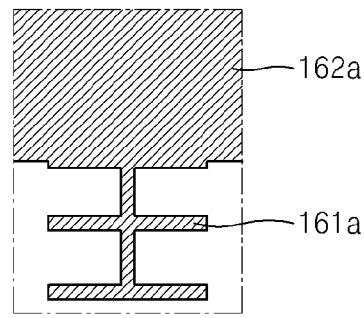
FIGS. 6A through 6E are diagrams showing exposure monitoring patterns formed on a substrate according to a bias degree of an actual exposure region from an exposure region, when a photolithography process is performed by using the reticle including the exposure monitoring key shown in FIG. 5A.

FIGS. 6A though 6E show exposure monitoring patterns formed on the substrate according to a dislocation degree of the actual exposure region from the exposure region E, when the photolithography process is performed by using the reticle including the exposure monitoring key 210a of FIG. 5A.

Referring to FIG. 6A, an exposure monitoring pattern 161a and a shadow portion 162a may be formed on the substrate 160. As shown in FIG. 6A, the exposure monitoring pattern 161a may correspond to half of the exposure monitoring key 210a, which denotes that the actual exposure region is exactly equal to the exposure region E.

As described above, the exposure region E is a region that is designed to be exposed to the light in the exposure process, and the actual exposure region is a region to which the light is irradiated in the exposure process.

The shadow portion 162a is formed because the light is blocked by the movable blade 121a of the blind 120.

Figure 6B:
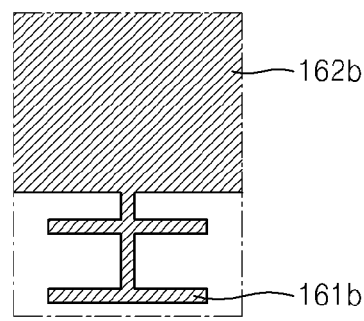

Referring to FIG. 6B, an exposure monitoring pattern 161b and a shadow portion 162b may be formed on the substrate 160. As shown in FIG. 6B, the exposure monitoring pattern 161b may include two gradations. This means that the actual exposure region is dislocated from the exposure region E within a normal range.

Figure 6C:
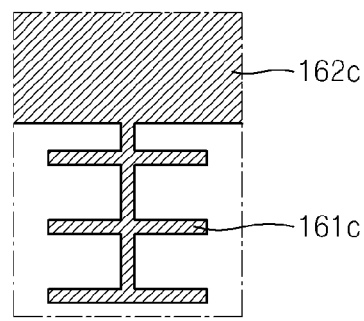

Referring to FIG. 6C, an exposure monitoring pattern 161c and a shadow portion 162c may be formed on the substrate 160. As shown in FIG. 6C, the exposure monitoring pattern 161c may include three gradations. This means that the actual exposure region is dislocated from the exposure region E within a normal range.

Figure 6D:
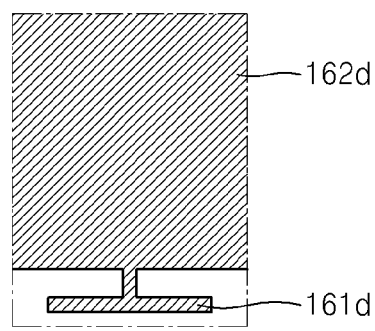

Referring to FIG. 6D, an exposure monitoring pattern 161d and a shadow portion 162d may be formed on the substrate 160. As shown in FIG. 6D, the exposure monitoring pattern 161d may include one gradation. This means that the actual exposure region is excessively dislocated from the exposure region E. The operator may easily identify that there is a high possibility that defects may be generated due to a misalignment between the blind 120 and the reticle 200 during the exposure process, and then, the operator may correct the defects of the substrate 160 or may determine whether the substrate 160 is to be discarded by precisely checking the substrate 160.

Figure 6E:
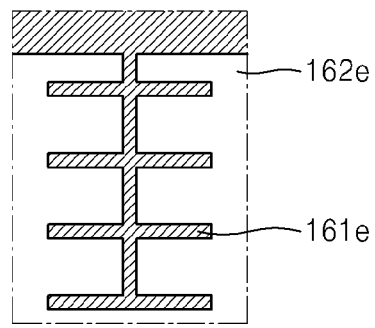

Referring to FIG. 6E, an exposure monitoring pattern 161e and a shadow portion 162e may be formed on the substrate 160. As shown in FIG. 6E, the exposure monitoring pattern 161e may include four gradations. This means that the actual exposure region is excessively dislocated from the exposure region E. The operator may easily identify that there is a high possibility that defects may be generated due to the misalignment between the blind 120 and the reticle 200 during the exposure process, and then, the operator may correct the defects of the substrate 160 or may determine whether the substrate 160 is to be discarded by precisely checking the substrate 160.

As shown in FIGS. 6A through 6E, from the exposure monitoring patterns 161a through 161e shown on the substrate 160, the operator may recognize whether there is a misalignment between the blind 120 and the reticle 200, and if there is a misalignment, the operator may recognize whether the misalignment is within the normal range without having to perform an additional test process.

Therefore, waste of costs occurring when post-processes are performed on the substrate without recognizing the defects generated due to the misalignment between the blind 120 and the reticle 200 may be prevented.

Figure 7:
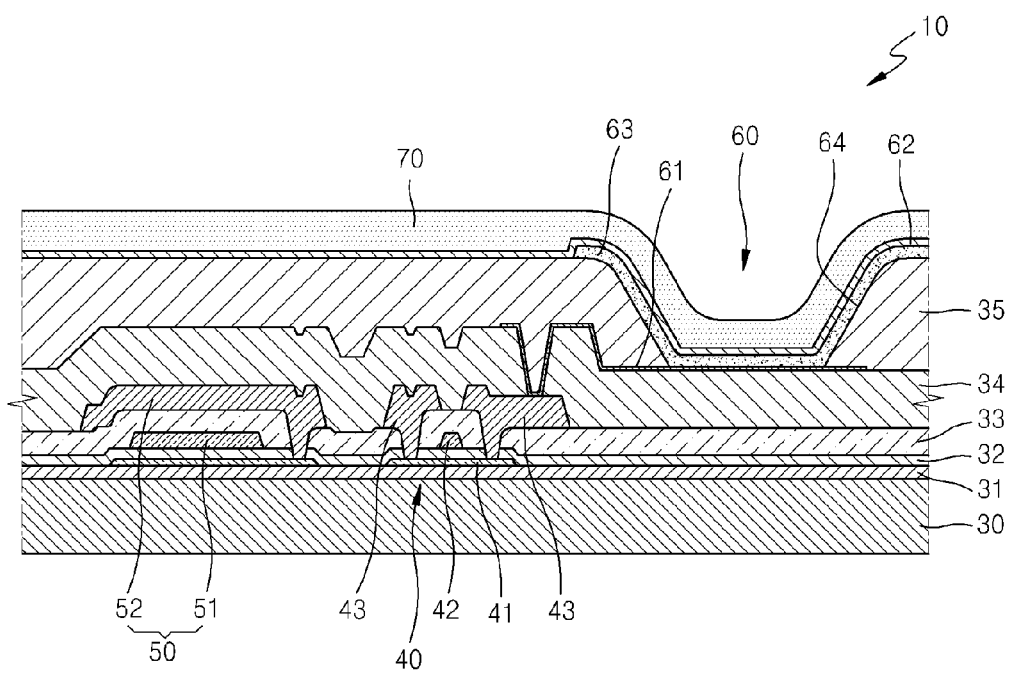
FIG. 7 is a cross-sectional view schematically showing a flat panel display apparatus that may be manufactured by using a reticle or an exposure apparatus constructed as embodiments according to the principles of the present invention.

FIG. 7 is a cross-sectional view schematically showing a flat panel display apparatus that may be manufactured by using the reticle or the exposure apparatus according to embodiments of the present invention.

In more detail, FIG. 7 shows a flat panel display apparatus, for example, an organic light emitting display apparatus 10, that is manufactured by using the exposure apparatus shown in FIG. 1 or the reticle 200 shown in FIGS. 3A and 3B, FIGS. 4A and 4B, and FIGS. 5A through 5H.

The organic light emitting display apparatus 10 may be formed on a substrate 30. The substrate 30 may be formed of a glass material, a plastic material, or a metal material.

A buffer layer 31 may be formed on the substrate 30. The buffer layer 31 provides a flat surface on the substrate 30, and may include an insulating material for preventing moisture and impurities from infiltrating into the substrate 30.

A TFT 40, a capacitor 50, and an organic light emitting device 60 may be formed on the buffer layer 31. The TFT 40 may include an active layer 41, a gate electrode 42, and source/drain electrodes 43. The organic light emitting device 60 may include a first electrode 61, a second electrode 62, and an intermediate layer 63. The capacitor 50 may include a first capacitor electrode 51 and a second capacitor electrode 52.

In particular, the active layer 41 of a predetermined pattern may be disposed on the buffer layer 31. The active layer 41 may include an inorganic semiconductor material such as silicon, an organic semiconductor material, or an oxide semiconductor material, and may be formed by injecting a p-type or n-type dopant.

A gate insulating layer 32 may be formed on the active layer 41. The gate electrode 42 may be formed on the gate insulating layer 32 to correspond to the active layer 41. The first capacitor electrode 51 may be formed on the gate insulating layer 32 by using a material that is the same as that of the gate electrode 42.

An interlayer dielectric 33 is formed to cover the gate electrode 42, and the source/drain electrodes 43 are formed on the interlayer dielectric 33 to contact predetermined regions of the active layer 41. The second capacitor electrode 52 may be formed on the interlayer dielectric 33 by using the same material as that of the source/drain electrodes 43.

A passivation layer 34 is formed to cover the source/drain electrodes 43, and an additional insulating layer may be formed on the passivation layer 34 for planarizing the TFT 40.

The first electrode 61 may be formed on the passivation layer 34. The first electrode 61 may be formed to be electrically connected to one of the source/drain electrodes 43. In addition, a pixel defining layer 35 may be formed to cover the first electrode 61.

A predetermined opening 64 is formed in the pixel defining layer 35, and the intermediate layer 63 including an organic emission layer may be formed in a region defined by the opening 64. The second electrode 62 may be formed on the intermediate layer 63. The organic emission layer may emit at least one of red light, green light, blue light, and white light.

An encapsulation layer 70 may be formed on the second electrode 62. The encapsulation layer 70 may have a structure in which organic layers and inorganic layers are alternately stacked.

The TFT 40, the capacitor 50, the electrodes, and wires of the organic light emitting display apparatus 10 may be formed through deposition processes, photolithography processes, and etching processes. Among the above processes, the photolithography process may be performed by using the reticle or the exposure apparatus according to embodiments of the present invention. That is, the active layer 41, the gate electrode 42, the first capacitor electrode 51, the interlayer dielectric 33, the source/drain electrodes 43, the second capacitor electrode 52, the passivation layer 34, and the first electrode 61 may be formed through the photolithography processes using the reticle or the exposure apparatus according to embodiments of the present invention.

Also, in addition to the organic light emitting display apparatus 10, thin films of a LCD apparatus or thin films of other various display apparatuses may be formed by using the reticle or the exposure apparatus according to the embodiments of the present invention.

According to the reticle of the present invention, if a misalignment occurs between the blind and the reticle, the misalignment may be readily apparent to the operator. Therefore, if defective patterns are generated, the post-processes may not be performed without correcting or discarding the substrates, and thus, wasteful manufacturing process may be avoided and manufacturing costs may be saved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A reticle, comprising:
an exposure region that is to be exposed to light during an exposure process;
a non-exposure region surrounding the exposure region and not to be exposed to the light during the exposure process; and
exposure monitoring keys disposed across a boundary between the exposure region and the non-exposure region,
the exposure region comprising a pattern region in which target patterns are disposed, one part of each of the exposure monitoring keys disposed in the exposure region from out of the pattern region, and another part of the each exposure monitoring key disposed in the non-exposure region.

2. The reticle of claim 1, wherein the boundary between the exposure region and the non-exposure region is formed as a rectangle, and the exposure monitoring keys are disposed at opposite sides of the boundary.

3. The reticle of claim 1, wherein the boundary between the exposure region and the non-exposure region is formed as a rectangle, and the exposure monitoring keys are disposed respectively at four sides of the boundary.

4. The reticle of claim 1, further comprising alignment marks disposed in the exposure region for aligning the reticle and an exposed member in the exposure process.

5. The reticle of claim 1, wherein each of the exposure monitoring keys is symmetrical to the boundary.

6. The reticle of claim 1, wherein each of the exposure monitoring keys is an embossed exposure monitoring key shielding against the light, and a peripheral portion of each embossed exposure monitoring key transmits the light.

7. The reticle of claim 1, wherein each of the exposure monitoring keys is an engraved exposure monitoring key transmitting the light, and a peripheral portion of each engraved exposure monitoring key blocks the light.

8. The reticle of claim 1, wherein the boundary between the exposure region and the non-exposure region is formed as a rectangle, an exposure monitoring key disposed at one side of the boundary is an embossed exposure monitoring key shielding against the light, and the exposure monitoring key disposed at another side of the boundary is an engraved exposure monitoring key transmitting the light.

9. The reticle of claim 1, wherein each of the exposure monitoring keys comprises gradations representing a degree of dislocation of an actual exposure region that is exposed during the exposure process from the exposure region of the reticle.

10. An exposure apparatus, comprising:
a light source emitting light for performing an exposure process;
a reticle as claimed in claim 1; and
a blind disposed between the light source and the reticle and comprising an open region so that a part of the light emitted from the light reaches the exposure region of the reticle.

11. The exposure apparatus of claim 10, wherein the blind comprises a pair of first blades that are movable in a first direction, and the open region has a width that is variable corresponding to a movement of the pair of the first blades.

12. The exposure apparatus of claim 11, wherein the exposure monitoring keys of the reticle comprise a pair of first exposure monitoring keys, at least a part of which is not exposed to the light when the light is blocked by the pair of first blades.

13. The exposure apparatus of claim 11, wherein the blind further comprises a pair of second blades movable in a second direction, and the open region has a length that is variable corresponding to a movement of the pair of second blades.

14. The exposure apparatus of claim 13, wherein the exposure monitoring keys of the reticle comprise a pair of second exposure monitoring keys, at least a part of which is not exposed to the light when the light is blocked by the pair of second blades.

15. The exposure apparatus of claim 10, wherein each of the exposure monitoring keys comprises gradations, and the gradations denote a degree of dislocation of an actual exposure region, which the light actually reaches after passing through the open region of the blind, from the exposure region of the reticle.

16. An exposure method, comprising:
providing a reticle as claimed in claim 1;
emitting light from a light source;
transmitting a first part of the light emitted from the light source and blocking a second part of the light by using a blind;
projecting images of target patterns of the reticle and partial images of the exposure monitoring keys formed on the reticle onto a photoresist layer coated on a substrate by using the first part of the light; and
patterning the photoresist layer by transferring the images of the target patterns of the reticle and the partial images of the exposure monitoring keys to the photoresist layer.

17. The exposure method of claim 16, further comprising determining a dislocation degree of an actual exposure region, which the first part of the light actually reaches through the reticle, from the exposure region of the reticle.

18. The exposure method of claim 16, wherein the blind comprises a pair of first blades movable in a first direction, the first part of the light being adjusted by moving the pair of first blades in the first direction, the exposure monitoring keys comprise a pair of first exposure monitoring keys, at least a part of which is not exposed to the light when the light is blocked by the pair of first blades, and images of the at least part of the pair of first exposure monitoring keys are projected onto the substrate by the first part of the light.

19. A method of manufacturing a flat panel display apparatus, the method comprising performing exposure of a substrate by using the exposure method of claim 16.

* * * * *